United States Patent
Kim

(10) Patent No.: US 8,120,972 B2
(45) Date of Patent: Feb. 21, 2012

(54) SEMICONDUCTOR MEMORY APPARATUS AND TEST CIRCUIT THEREFOR

(75) Inventor: Seung Bong Kim, Ichon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 253 days.

(21) Appl. No.: 12/431,131

(22) Filed: Apr. 28, 2009

(65) Prior Publication Data

US 2010/0128540 A1   May 27, 2010

(30) Foreign Application Priority Data

Nov. 27, 2008 (KR) .................. 10-2008-0118706

(51) Int. Cl.
 *G11C 7/10* (2006.01)
(52) U.S. Cl. .......... 365/189.08; 365/201; 365/230.03; 365/189.07; 365/194
(58) Field of Classification Search .......... 365/200, 365/201, 230.03, 189.08, 189.07
See application file for complete search history.

(56) References Cited

U.S. PATENT DOCUMENTS

| | | | | |
|---|---|---|---|---|
| 5,488,583 A * | 1/1996 | Ong et al. | ...... | 365/201 |
| 5,511,029 A * | 4/1996 | Sawada et al. | ...... | 365/201 |
| 6,418,072 B2 * | 7/2002 | Nakaya et al. | ...... | 365/201 |
| 6,466,490 B2 | 10/2002 | Nagai et al. | | |
| 6,515,921 B2 * | 2/2003 | Koshikawa | ...... | 365/200 |
| 6,584,025 B2 * | 6/2003 | Roohparvar et al. | ...... | 365/201 |
| 6,985,395 B2 | 1/2006 | Yoshimatsu et al. | | |
| 7,376,026 B2 | 5/2008 | Vollrath et al. | | |

FOREIGN PATENT DOCUMENTS

| | | |
|---|---|---|
| JP | 2002-230998 | 8/2002 |
| KR | 1020050089900 A | 9/2005 |
| KR | 1020070021512 A | 2/2007 |

* cited by examiner

*Primary Examiner* — Pho M Luu
*Assistant Examiner* — Thao Bui
(74) *Attorney, Agent, or Firm* — IP & T Group LLP

(57) ABSTRACT

A test circuit for a semiconductor memory apparatus of an open bit-line structure includes a compression part configured to, in response to test data read from a plurality of memory cells included in a test target cell mat and a compression control signal generated from a compression control signal generating part, compress the test data that are read from the memory cells that share a sense amplifier block and sequentially output compression test signals.

20 Claims, 4 Drawing Sheets

SEMICONDUCTOR MEMORY APPARATUS AND TEST CIRCUIT THEREFOR

CROSS-REFERENCES TO RELATED PATENT APPLICATION

The present application claims priority under 35 U.S.C 119(a) to Korean Application No. 10-2008-0118706, filed on Nov. 27, 2008, in the Korean Intellectual Property Office, which is incorporated herein by reference in its entirety as set forth herein in full.

BACKGROUND

1. Technical Field

The embodiment described herein relates to a semiconductor memory apparatus and, more particularly, to a semiconductor memory apparatus and a test circuit therefor.

2. Related Art

In order to realize high integration of semiconductor memory apparatuses, the semiconductor memory apparatuses are being implemented in an open bit-line structure (6F2).

Unlike known folded bit-line structures in which a bit-line and a bit-line-bar are provided in the same cell mat, the bit-line and the bit-line-bar are provided in different cell mats in open bit-line structures.

FIG. 1 is a diagram for illustrating a structure of a known open bit-line semiconductor memory apparatus.

As shown in the figure, the semiconductor memory apparatus includes a plurality of cell mats 10-1, 10-2, and 10-3 and each of the cell mats 10-1, 10-2, and 10-3 is provided with a plurality of memory cells C that are connected to word lines 'WL0' to 'WLi' and open bit-lines 'BL0' to 'BLj'. Moreover, sense amplifier blocks 20-1 and 20-2 are disposed among the cell mats 10-1, 10-2, and 10-3. Bit-lines 'BL0/BLb0' to 'BLj/BLbj' connected to memory cells of two adjacent cell mats are commonly connected to sense amplifiers 'SA'. That is, when the word line (for example, WL1) connected to the memory cell 'C' included in the cell mat 10-1 is selected and the bit-line (for example, 'BL3') is activated, the sense amplifier 'SA' amplifies and outputs data recorded in the corresponding memory cell depending on a potential difference between the bit-line 'BL3' connected to the corresponding memory cell 'C' and the bit-line-bar 'BLb3' existing in the adjacent cell mat 10-3. In such an open bit-line structure, in a test mode for checking whether or not each memory cell is defective, data recorded in all memory cells included in the cell mat 10-1 are amplified by the sense amplifier 'SA' and outputted through local input/output lines 'LIO<0:n>/LIOb<0:n>'. Data outputted from the local input/output lines 'LIO<0:n>/LIOb<0:n>' are integrated into one data and whether or not the data are defective is checked.

If a predetermined memory cell 'CF' is defective, an integration result of data outputted from the local input/output line 'LIO<0:n>/LIOb<0:n>' that is connected with a first sense amplifier block 20-1 and a second sense amplifier block 20-2 is different from reference data. In this case, it is determined that the corresponding cell mat 10-1 is defective, such that a repair is performed for each cell mat. However, when the repair is performed, the bit-line and the bit-line-bar are repaired independently from each other or only one of two is repaired, such that reliability of the semiconductor memory apparatus is deteriorated.

Therefore, the cell mat 10-1 including the defective memory cell and the adjacent cell mats 10-2 and 10-3 which share the bit-line are repaired together. That is, in the case of the defective memory cell 'CF', although the bit-line exists in the first cell mat 10-1 and the bit-line-bar exists in the second cell mat 10-2, even a third cell mat 10-3 is repaired.

As such, whether or not the cell mats are defective is checked by integrating data of all memory cells included in each cell mat, where unnecessary cell mats are repaired. Therefore repair efficiency and yield are deteriorated.

SUMMARY

A semiconductor memory apparatus and a test circuit therefor that repairs only a cell mat that shares a sense amplifier with a defective memory cell in a semiconductor memory apparatus of an open bit-line structure are disclosed herein.

Further, a semiconductor memory apparatus and a test circuit therefor that can improve repair efficiency in a semiconductor memory apparatus of an open bit-line structure are disclosed herein.

In one aspect, a test circuit for a semiconductor memory apparatus of an open bit-line structure includes a compression part configured to, in response to test data read from a plurality of memory cells included in a test target cell mat and a compression control signal generated from a compression control signal generating part, compress the test data that are read from the memory cells that share a sense amplifier block and sequentially output compression test signals.

Meanwhile, in another aspect, a semiconductor memory apparatus includes a plurality of cell mats configured to include a plurality of memory cells, a plurality of sense amplifier blocks configured to be disposed between the plurality of cell mats and connected to bit-lines that are connected to memory cells of two adjacent cell mats, and a compression part configured to sequentially output compression test signals by compressing test data read from memory cells that share the sense amplifier blocks in response to a compression control signal outputted from the compression control signal generating part for a test operation.

in yet another aspect, a method for testing memory cells includes outputting data from a first group of memory cells through input/output lines connected to a sense amplifier block, outputting data from a second group of memory cells through the input/output lines, compressing the data output from the first group of memory cells, compressing the data output from the second group of memory cells, and after outputting the compressed data from one of the first and second groups of memory cells, outputting the compressed data from the other one of the first and second groups of memory cells.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
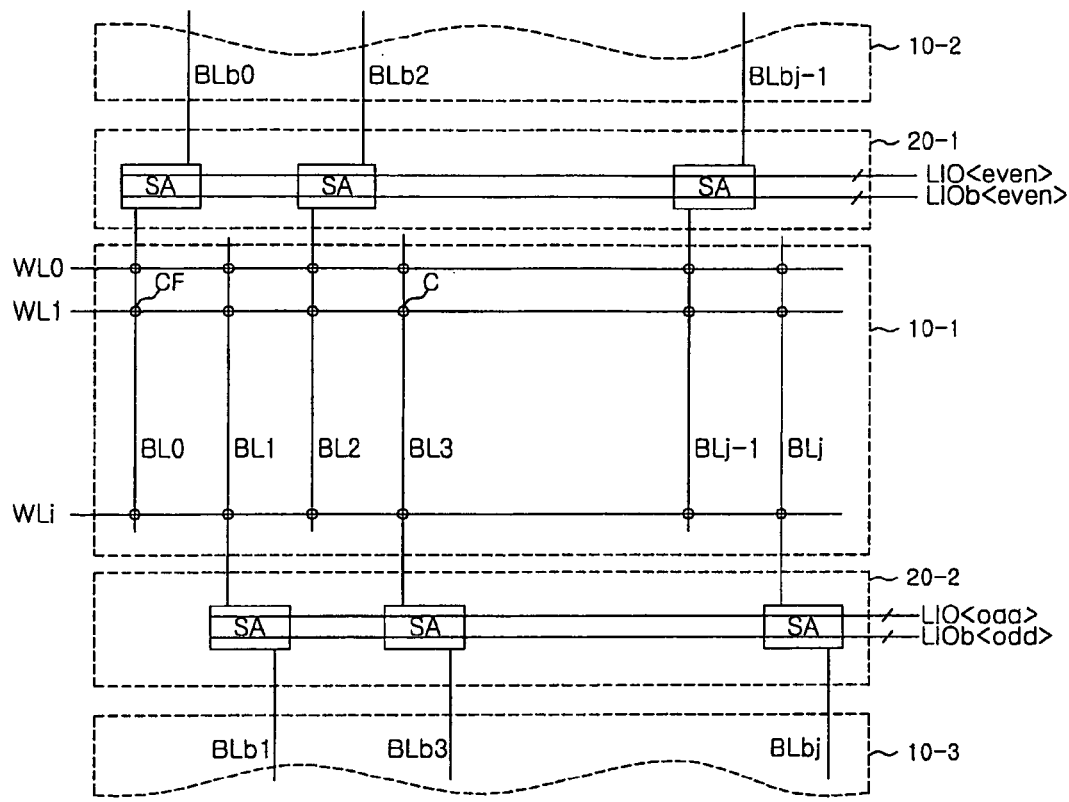
FIG. 1 is a diagram for illustrating a structure of a known open bit-line semiconductor memory apparatus.
Figure 2:
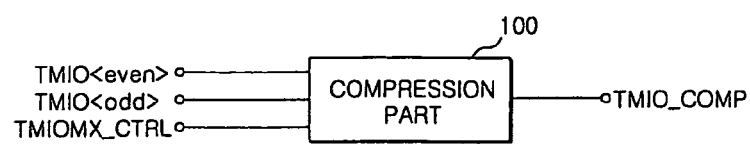
FIG. 2 is a configuration diagram of an exemplary test circuit of a semiconductor memory apparatus according to one embodiment.

FIG. 2 is a configuration diagram of an exemplary test circuit of a semiconductor memory apparatus according to one embodiment.

As shown in the figure, the test circuit according to one embodiment can include a compression part 100 that can receive data (hereinafter, referred to as "test data") 'TMIO<0:n>' that are read from memory cells included in each cell mat and a compression control signal 'TMIOMX_CTRL' and output a compression test signal 'TMIO_COMP' by compressing test data 'TMIO<even>' and 'TMIO<odd>' read from memory cells sharing a sense amplifier block, in a test mode of a semiconductor memory apparatus of an open bit-line structure.

More specifically, in the test mode, when word lines 'WL0' to 'WLi' of a first cell mat are selected and bit-lines 'BL0' to 'BLj' are activated, sense amplifiers 'SA' output data stored in each memory cell in accordance with a potential difference between the bit-line and the bit-line-bar through local input/output lines.

At this time, some (for example, even numbered memory cells) of a plurality of memory cells included in the first cell mat share the sense amplifier block with memory cells included in an adjacent second cell mat in which the bit-line-bar is formed. In addition, the rest (for example, odd numbered cells) share the sense amplifier block with memory cells included in an adjacent third cell mat in which the bit-line-bar is formed.

Data outputted from the local input/output lines connected to the sense amplifier block shared by the memory cells are compressed so as to check which sense amplifier block is connected to a memory cell that has failed.

Accordingly, only two cell mats verified to have failed may be replaced, such that it is possible to improve repair efficiency.

Figure 3:
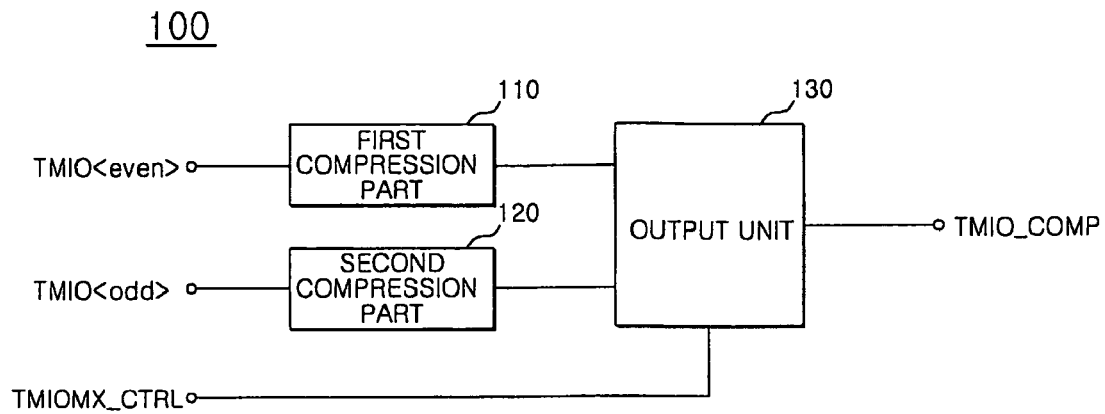
FIG. 3 is a configuration diagram of an exemplary compression part shown in FIG. 2 according to one embodiment.

FIG. 3 is a configuration diagram of an exemplary compression part shown in FIG. 2 according to one embodiment.

The compression part 100 can include a first compression unit 110, a second compression unit 120, and an output unit 130.

The first compression unit 110 may receive test data outputted from some of the memory cells included in a predetermined cell mat, for example, test data 'TMIO<even>' outputted from a half of the memory cells and compress the test data 'TMIO<even>' as one data. The second compression unit 120 can receive test data outputted from some of the memory cells included in a predetermined cell mat, for example, test data 'TMIO<odd>' outputted from the other half of the memory cells and compress the test data 'TMIO<odd>' as one data. In addition, the output unit 130 outputs output data of the first compression unit 110 and output data of the second compression unit 120 in sequence as a compression test signal 'TMIO_COMP' in response to the output data of the first and second compression units 110 and 120 and a compression control signal 'TMIOMX_CTRL'.

Figure 4:
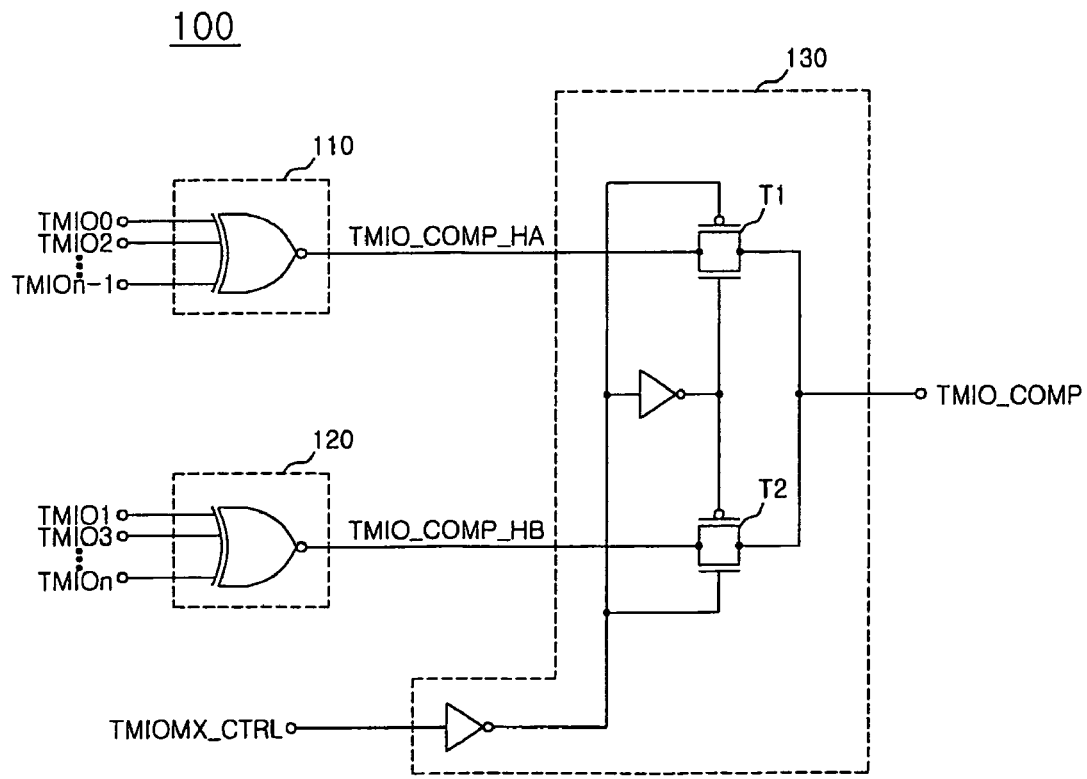
FIG. 4 is a circuit diagram of the exemplary compression part shown in FIG. 3 according to one embodiment.

FIG. 4 is a circuit diagram of the exemplary compression part of FIG. 3 according to one embodiment.

As shown in the figure, the first and second compression units 110 and 120 can integrate input data in one level. In the preferred embodiment of the present invention, the first and second compression units 110 and 120 may become exclusive OR (XOR) operational elements that output low-level signals when all input levels are the same.

Herein, test data 'TMIO<0>', 'TMIO<2>', . . . , 'TMIO<n−1>' may be inputted into the first compression unit 110, which are read from memory cells connected to even numbered bit-lines among memory cells included in a predetermined cell mat and test data 'TMIO<1>', 'TMIO<3>', . . . , 'TMIO<n>' may be inputted into the second compression unit 120, which are read from memory cells connected to odd numbered bit-lines.

First compression data 'TMIO_COMP_HA' outputted from the first compression unit 110 and second compression data 'TMIO_COMP_HB' outputted from the second compression unit 120 are inputted into the output unit 130 driven by the compression control signal 'TMIOMX_CTRL'.

The output unit 130 is configured to include a transmitter for outputting the first compression control signal 'TMIO_COMP_HA' and the second compression data 'TMIO_COMP_HB' in sequence in response to the compression control signal 'TMIOMX_CTRL'.

More specifically, the output unit 130 can include a first transmission transistor 'T1' and a second transmission transistor 'T2'.

The first transmission transistor 'T1' is driven by the compression control signal 'TMIOMX_CTRL' and an inverted signal thereof to pass the first compression data 'TMIO_COMP_HA'. In addition, the second transmission transistor T2 is driven by a signal inverting a driving signal of the first transmission transistor T1 to pass the second compression data 'TMIO_COMP_HB'.

Herein, the test data 'TMIO<0:n>' are read from each memory cell as a test mode signal 'TMHIO' is enabled and will be described below with reference to FIG. 5.

Figure 5:
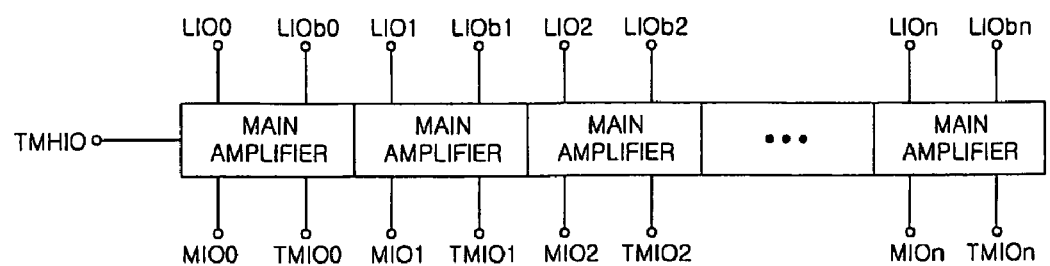
FIG. 5 is a circuit diagram of an exemplary test data generating unit according to one embodiment.

FIG. 5 is a circuit diagram of an exemplary test data generating unit according to one embodiment.

Data applied to local input/output lines 'LIO<0:n>/LIOb<0:n>' are inputted into main amplifiers. Main data 'MIO' are outputted from each main amplifier when the test mode signal 'TMHIO' is disabled, that is, in a normal operation mode.

In addition, when the test mode signal 'TMHIO' for detecting a defective cell is enabled, the test data 'TMIO<0:n>' are outputted from the main amplifiers and inputted into the first and second compression units 110 and 120.

Meanwhile, the compression control signal 'TMIOMX_CTRL' is generated in response to a read pulse 'RDP' generated by a read command 'RD' and the test mode signal 'TMHIO' and will be described below with reference to FIG. 6.

Figure 6:
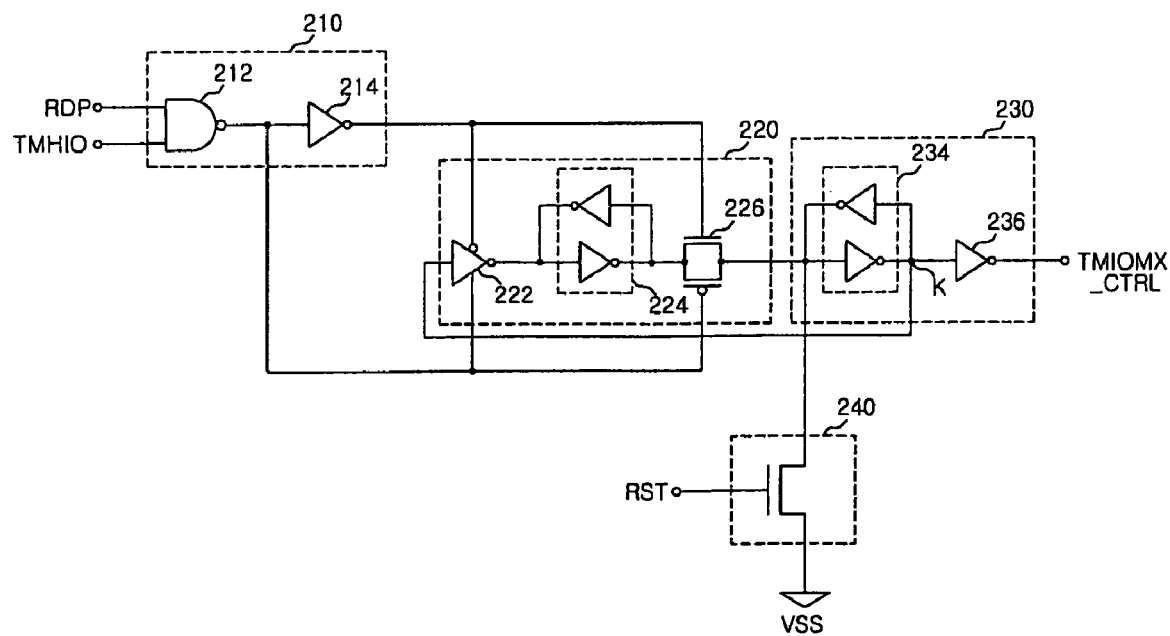
FIG. 6 is a circuit diagram of an exemplary compression control signal generating part according to one embodiment.

FIG. 6 is a circuit diagram of an exemplary compression control signal generating part according to one embodiment.

As shown in the figure, the compression control signal generating part 200 may include an input unit 210, a transmission unit 220, and an output unit 230.

The input unit 210 may output a signal for determining whether the test mode for a read operation is performed by inputting the pulse signal 'RDP' generated when the read command 'RD' is given and the test mode signal 'TMHIO'. The input unit 210 can be configured by connecting a NAND gate 212 and an inverter 214 in series, for example.

The transmission unit 220 can output the output signal of the input unit 210 by delaying the output signal of the input unit 210 for a predetermined time. For this, the transmission unit 220 can include an inverter 222 that is driven in accordance with the output signal of the input unit 210 to invert a potential of an output node 'K', a first latch portion 224 that inversely delays an output signal of the inverter 222, and a transmission transistor 226 that is driven in accordance with the output signal of the input unit 210 to output a signal stored in the first latch portion 224.

Meanwhile, the output unit 230 can include a second latch portion 234 in order to output the output node 'K' by delaying the output signal of the transmission unit 220 for a predetermined time. Herein, an output signal of the second latch portion 234 can be inverted by an inverter 236 and outputted as the compression control signal 'TMIOMX_CTRL'.

In the preferred embodiment of the present invention, the compression control signal generating part 200 can further include an initialization unit 240 that is connected to between an output terminal of the transmission unit 220 and a ground terminal and driven by a reset signal 'RST'. Moreover, the initialization unit 240 may be constituted by a switching element driven by the reset signal 'RST'.

An operation of the above-mentioned test circuit will be described below.

Figure 7:
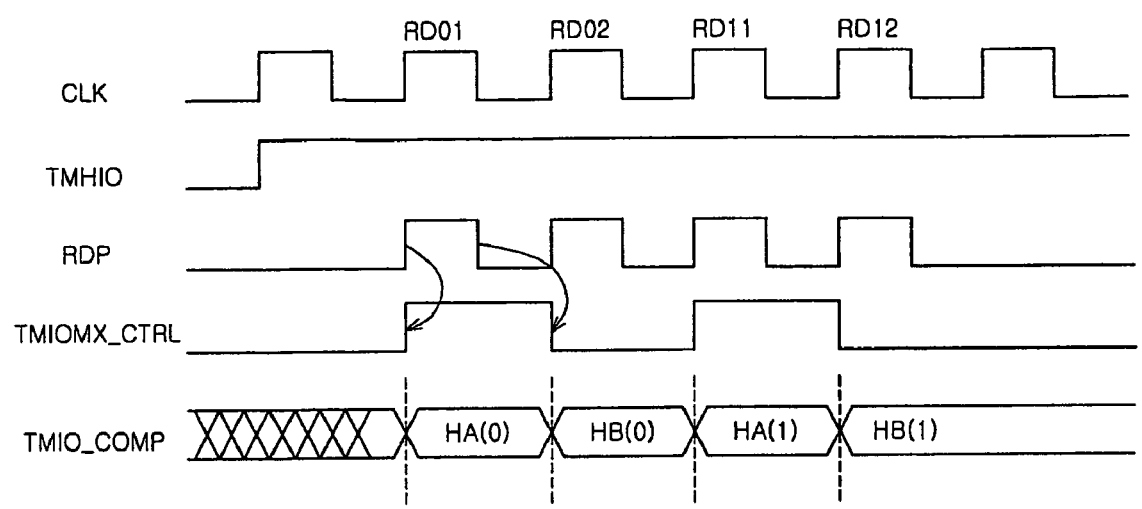
FIG. 7 is a timing diagram for illustrating an operation of an exemplary test circuit according to one embodiment.

FIG. 7 is a timing diagram for illustrating an operation of an exemplary test circuit according to one embodiment.

The read command 'RD' is inputted twice at a test mode for checking the defective cell in the semiconductor memory apparatus of the open bit-line structure.

As the test mode signal 'TMHIO' is enabled and a first read command 'RD01' is inputted, the test data 'TMIO<0:n>' read from the memory cells included in the predetermined cell mat are outputted from the main amplifiers. In addition, a half 'TMIO<even>' of the test data are inputted into the first compression unit 110 and the other half 'TMIO<odd>' are inputted into the second compression unit 120.

Moreover, as the read pulse 'RDP' is enabled by the read command 'RD01', the compression control signal 'TMIOMX_CTRL' is outputted at a high level. The output unit 130 is driven by the compression control signal 'TMIOMX_CTRL', such that the first compression data 'TMIO_COMP_HA' is outputted as a compression test signal 'TMIO_COMP_HA(0)'.

Thereafter, when the read pulse 'RDP' is disabled, the compression control signal 'TMIOMX_CTRL' is at a low level. At this time, as the second read command 'RD02' is inputted, the test data 'TMIO<0:n>' read from the memory cells are outputted from the main amplifiers.

Likewise, a half 'TMIO<even>' of the test data are inputted into the first compression unit 110 and the other half 'TMIO<odd>' are inputted into the second compression unit 120. The second compression data 'TMIO_COMP_HB' is outputted as a compression test signal 'TMIO_COMP_HB(0)' by a low level compression control signal 'TMIOMX_CTRL'.

Next, compression test signals 'HA(1)' and 'HB(1)' for different cell mats are outputted by being operated in the same manner for read commands 'RD11' and 'RD12'.

According to the embodiment described herein, when a defective cell or a defective bit-line is generated by compressing test data which are outputted from a memory cell group that shares a sense amplifier block, a repair is performed for each cell mat that shares the sense amplifier block.

Accordingly, it is possible to improve yield of a semiconductor memory apparatus by preventing unnecessary repairs.

An open bit-line structure is effective for high integration of a semiconductor memory apparatus. A test circuit according to one embodiment can easily detect cell mats that share a relevant memory cell and a relevant sense amplifier when a failure occurs. Accordingly, it is possible to improve repair efficiency and enhance productivity by reducing the number of cell mats to be repaired.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. A test circuit for a semiconductor memory apparatus of an open bit-line structure, the test circuit comprising:
   a compression part configured to, in response to test data read from a plurality of memory cells included in a pair of adjacent cell mats and a compression control signal outputted from a compression control signal generating part, compress the test data that are read from the memory cells that share a sense amplifier block and sequentially output compression test signals,
   wherein
   the sense amplifier block is disposed between the pair of adjacent cell mats,
   bit-lines of the adjacent cell mats are configured to be connected in common to the sense amplifier block, and
   the compression part includes:
      a first compression unit confiured to receive test data outputted from memory cells connected to even numbered bit-lines for the plurality of memory cells included in the pair of adjacent cell mats and output a first compression data: and
      a second compression unit configured to receive test data outputted from memory cells connected to odd numbered bit-lines for the plurality of memory cells included in the pair of adjacent cell mats and output a second compression data.

2. The test circuit of claim 1, wherein the compression part further includes:
   an output unit configured to, in response to output data of the first and second compression units and the compression control signal, output the output data of the first compression unit and the output data of the second compression unit in sequence.

3. The test circuit of claim 2, wherein the output unit includes a transmitter configured to output an output signal of the first compression unit and an output signal of the second compression unit in sequence in response to the compression control signal.

4. The test circuit of claim 3, wherein the transmitter includes:
   a first transmission transistor configured to pass the output signal of the first compression unit while being driven by the compression control signal; and
   a second transmission transistor configured to pass the output signal of the second compression unit while being driven by an inverted signal of the compression control signal.

5. The test circuit of claim 1, wherein the first compression unit is a first logic element configured to receive the test data read from a first adjacent cell mat of the pair of adjacent cell mats and output first compression data depending on whether or not logic levels of the received test data are the same.

6. The test circuit of claim 1, wherein the second compression unit is a second logic element configured to receive the test data read from a second adjacent cell mat of the pair of adjacent cell mats and output second compression data depending on whether or not logic levels of the received test data are the same.

7. The test circuit of claim 1, wherein the compression control signal generating part includes:
- an input unit configured to compare and output a read pulse signal enabled in accordance with a read command and a test mode signal;
- a transmission unit configured to output an output signal of the input unit by delaying the output signal of the input unit for a predetermined time; and
- an output unit configured to output the compression control signal through an output node by delaying an output signal of the transmission unit for a predetermined time.

8. The test circuit of claim 7, wherein the transmission unit includes:
- an inverter configured to invert a potential of the output node while being driven in accordance with the output signal of the input unit;
- a first latch portion configured to invert and delay an output signal of the inverter; and
- a transmission transistor configured to output a signal stored in the first latch portion while being driven in accordance with the output signal of the input unit.

9. The test circuit of claim 8, wherein the compression control signal generating part further includes an initialization unit that is connected between an output terminal of the transmission unit and a ground terminal and driven by a reset signal.

10. The test circuit of claim 1, wherein each of the adjacent cells mats includes memory cells.

11. A semiconductor memory apparatus, comprising:
- a plurality of cell mats including a plurality of memory cells;
- a plurality of sense amplifier blocks disposed between the plurality of cell mats, wherein each sense amplifier block is connected to memory cells of each of two adjacent cell mats of the plurality of cell mats through bit lines; and
- a compression part configured to sequentially output compression test signals by compressing test data read from the memory cells of the two adjacent cells mats that share one of sense amplifier blocks in response to a compression control signal outputted from a compression control signal generating part for a test operation, wherein the compression part includes:
  - a first compression unit configured to receive test data outputted from memory cells connected to even numbered bit-lines for the plurality of memory cells included in a test target cell mat and output a first compression data: and
  - a second compression unit configured to receive test data outputted from memory cells connected to odd numbered bit-lines for the plurality of memory cells included in the test target cell mat and output a second compression data.

12. The semiconductor memory apparatus of claim 11, the compression part further includes:
- an output unit configured to, in response to output data of the first and second compression units and the compression control signal, output the output data of the first compression unit and the output data of the second compression unit in sequence.

13. The semiconductor memory apparatus of claim 12, wherein the output unit includes a transmitter configured to output an output signal of the first compression unit and an output signal of the second compression unit in sequence in response to the compression control signal.

14. The semiconductor memory apparatus of claim 13, wherein the transmitter includes:
- a first transmission transistor configured to pass the output signal of the first compression unit while being driven by the compression control signal; and
- a second transmission transistor configured to pass the output signal of the second compression unit while being driven by an inverse signal of the compression control signal.

15. The semiconductor memory apparatus of claim 11, wherein the first compression unit is a first logic element configured to receive the test data read from a first adjacent cell mat of the two adjacent cell mats and output first compression data depending on whether or not logic levels of the received test data are the same.

16. The semiconductor memory apparatus of claim 11, wherein the second compression unit is a second logic element configured to receive the test data read from a second adjacent cell mat of the two adjacent cell mats and output second compression data depending on whether or not logic levels of the received test data are the same.

17. The semiconductor memory apparatus of claim 11, wherein the compression control signal generating part includes:
- an input unit configured to compare and output a read pulse signal enabled in accordance with a read command and a test mode signal;
- a transmission unit configured to output an output signal of the input unit by delaying the output signal of the input unit for a predetermined time; and
- an output unit configured to output the compression control signal through an output node by delaying an output signal of the transmission unit for a predetermined time.

18. The semiconductor memory apparatus of claim 17, wherein the transmission unit includes:
- an inverter configured to invert a potential of the output node while being driven in accordance with the output signal of the input unit;
- a first latch portion configured to invert and delay an output signal of the inverter; and
- a transmission transistor configured to output a signal stored in the first latch portion while being driven in accordance with the output signal of the input unit.

19. The semiconductor memory apparatus of claim 18, wherein the compression control signal generating part further includes an initialization unit that is connected between an output terminal of the transmission unit and a ground terminal and driven by a reset signal.

20. The semiconductor memory apparatus of claim 11, wherein each of the adjacent cells mats includes memory cells.

* * * * *